United States Patent
Hinz et al.

[11] Patent Number: 6,007,162
[45] Date of Patent: Dec. 28, 1999

[54] HYDRAULIC MOTOR-VEHICLE BRAKE SYSTEM WITH ANTI-LOCKING CONTROL AND AUTOMATIC ACTUATION OF THE BRAKES FOR THE CONTROL OF THE DRIVE AND/OR TRAVEL DYNAMICS

[75] Inventors: Axel Hinz, Neu-Anspach; Edwin Czarnetzki, Elz, both of Germany

[73] Assignee: ITT Manufacturing Enterprises Inc., Wilmington, Del.

[21] Appl. No.: 08/945,298

[22] PCT Filed: Apr. 6, 1996

[86] PCT No.: PCT/EP96/01500

§ 371 Date: Dec. 18, 1997

§ 102(e) Date: Dec. 18, 1997

[87] PCT Pub. No.: WO96/33081

PCT Pub. Date: Oct. 24, 1996

[51] Int. Cl.$^6$ .................................................. B60T 8/36
[52] U.S. Cl. ........................ 303/119.3; 303/119.2; 303/DIG. 3; 303/DIG. 4; 303/DIG. 10; 137/884
[58] Field of Search ................. 303/119.2, 119.3, 303/DIG. 3, DIG. 4, DIG. 10, 115.4; 137/884

[56] References Cited

U.S. PATENT DOCUMENTS 5,318,072 6/1994 Goedecke ........................ 137/884
5,449,227 9/1995 Steinberg et al. ............... 303/119.2
5,482,362 1/1996 Robinson ....................... 303/119.2
5,501,514 3/1996 Resch et al. ................... 303/115.4

FOREIGN PATENT DOCUMENTS

| 0 157 944 | 10/1985 | European Pat. Off. . |
| 0 411 826 | 2/1991 | European Pat. Off. . |
| 42 21 988 | 1/1994 | Germany . |
| 42 26 646 | 2/1994 | Germany . |
| 43 20 391 | 12/1994 | Germany . |
| 2 249 874 | 5/1992 | United Kingdom . |
| 88/03491 | 5/1988 | WIPO . |

*Primary Examiner*—Robert J. Oberleitner
*Assistant Examiner*—Mariano Sy
*Attorney, Agent, or Firm*—Rader, Fishman & Grauer PLLC

[57] ABSTRACT

A hydraulic automotive vehicle brake system with brake slip control and automatic brake management for traction control and/or driving dynamics control includes a braking pressure generator which is hydraulically connectable to at least one wheel brake and a pressure fluid accumulator by way of pressure modulation valves, at least one pump which is connected with its suction side to a pressure fluid accumulator and with its pressure side to a pressure fluid conduit that extends from the braking pressure generator to the wheel brake, the pressure fluid conduit comprising the pressure modulation valves and a pressure sensor that is connected to the pressure fluid conduit in between the braking pressure generator and the pressure modulation valves. The pressure sensor is accommodated in a housing which houses the pressure modulation valves.

5 Claims, 3 Drawing Sheets

6,007,162

HYDRAULIC MOTOR-VEHICLE BRAKE SYSTEM WITH ANTI-LOCKING CONTROL AND AUTOMATIC ACTUATION OF THE BRAKES FOR THE CONTROL OF THE DRIVE AND/OR TRAVEL DYNAMICS

BACKGROUND OF THE INVENTION

The present invention relates to a hydraulic automotive vehicle brake system with brake slip control and automatic brake management for active brake operations such as traction control and driving dynamics control.

German patent No. 42 32 311 discloses a hydraulic automotive vehicle brake system with anti-lock control which, in addition, includes automatic brake management for driving dynamics control to improve the vehicle tracking behavior. Special provisions must be made for driving dynamics control or traction slip control in order to have a prompt pressure fluid supply for brake management provided by a pump. Among others, the provisions include the arrangement of a pressure sensor at the pressure fluid conduit extending from the braking pressure generator, with a view to sensing the pilot pressure that is generated by the driver in the braking pressure generator.

A design variation relating to the arrangement of the pressure sensor on a special precharging device is shown in the journal ATZ, 96th edition, No. 11, on page 687. Generally, a complicated cable connection to the electronic control unit is required due to the positioning of the pressure sensor on the housing of the so-called charging piston unit.

Therefore, an object of the present invention is to provide a hydraulic automotive vehicle brake system with brake slip control and automatic brake management for traction control and/or driving dynamics control so that the pressure sensor can be mounted, by relatively reduced structural efforts, in a way being protected against external influences and electrically connectable to the electronic control unit in a virtually reliable fashion.

SUMMARY OF THE INVENTION

According to the present invention, this object is achieved for a hydraulic automotive vehicle brake system of the mentioned type by the characterizing features of patent claim 1. To reach the objective, the present invention is based on the idea of arranging the pressure sensor in a housing which accommodates the pressure modulation valves.

Further features and preferred design variations of the present invention can be seen in the subclaims which will be explained in the following, reference to the accompanying drawings.

DATAILED DESCRIPTION OF THE DRAWINGS

Figure 1:
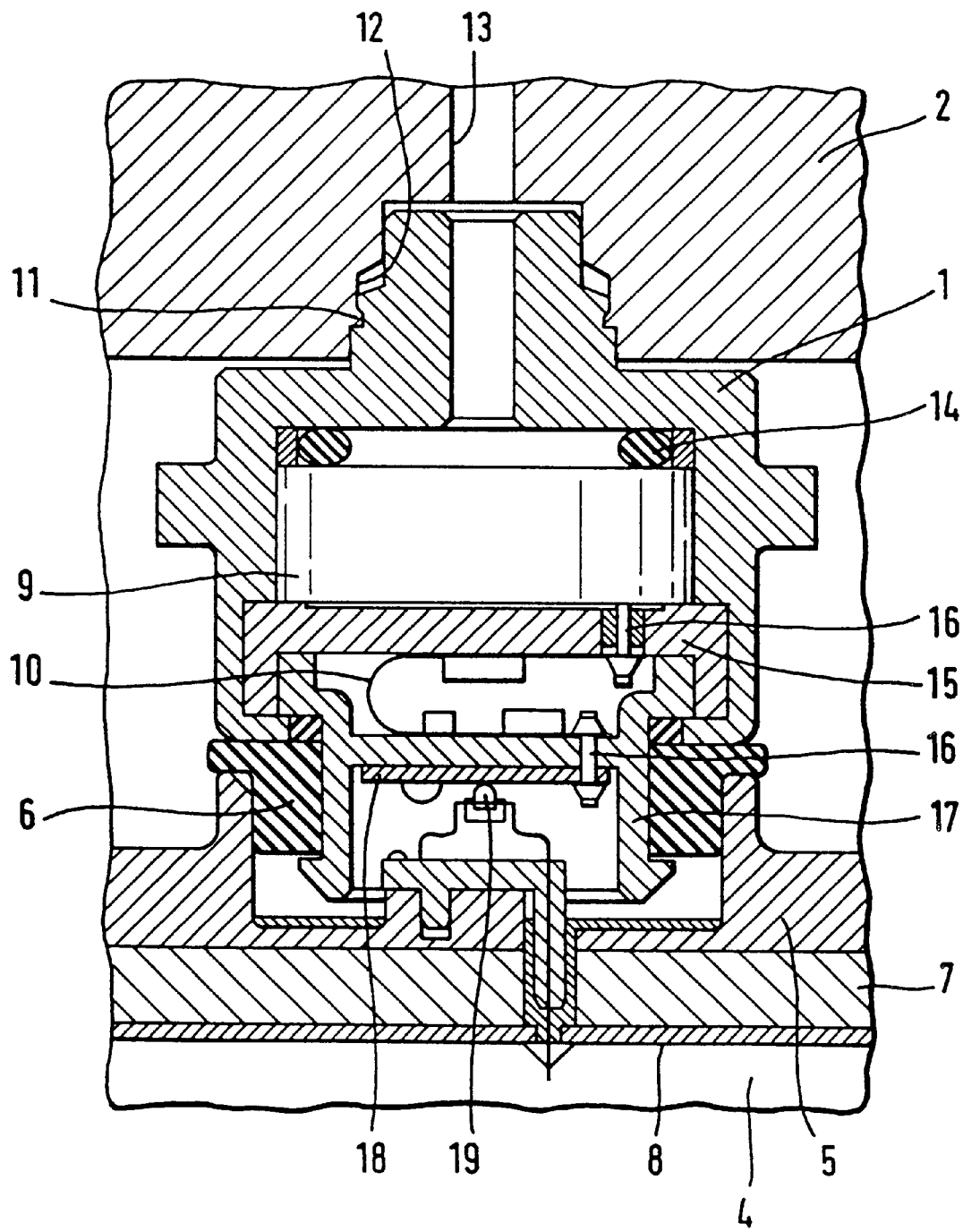
FIG. 1 is a cross-sectional view of a pressure sensor.

FIG. 1 shows in a view (which is not drawn to scale) a preferred embodiment of a pressure sensor 1 of the claimed invention. The pressure sensor 1, with its stepped housing, is attached by a self-caulking engagement 11 in a stepped bore 12 of a housing 2 accommodating pressure modulation valves 3. The section of the housing 2 illustrates a branch line of pressure fluid conduit 13 which provides a connection between a braking pressure generator (not shown) and the pressure modulation valves 3. Pressure sensor 1 includes a measuring elements chamber which houses a preferably capacitive transducer 9. An annular seal 14 is interposed between the housing of the pressure sensor 1 and the capacitive transducer 9. Seal 14 prevents the escape of pressure fluid from the pressure fluid conduit 13. Remote from the hydraulically applied end face of the transducer 9 is a supporting plate 15 which takes up the pressure force applied by the fluid to the transducer 9. Contact pins 16 at the transducer 9 extend through the supporting plate 15 until another hollow chamber of the pressure sensor 1 which houses electric or electronic components 10 of the pressure sensor 1. The electronic components 10 of the pressure sensor 1 can also be mounted on a printed circuit board 8. The hollow chamber for the electronic components 10 in the hollow chamber and to a contact 19 which is stationarily arranged in the cover 4. Cover 4 has a carrier plate 7 on which electric or electronic components 10 are mounted. In the present embodiment, the electric component 10 is configured as a printed circuit board which is soldered to the contact pins of the contacts 19 embedded in the carrier plate 7. Preferably, the contact pins are laminated with a plastic material in the bores of the carrier plate 7. Contacts 19 are not attached directly on the carrier plate 7 but are fixed in a plug connector 5, preferably made as a plastic injection-molded part. Plug connector 5, being part of the cover 4, is slipped with its bowl-shaped recess on the plug housing 17 of the pressure sensor 1. To seal the bowl-shaped aperture between the plug housing 17 and plug connector 5, preferably, a profile seal 6 is arranged which, in the present illustration, is retained as a preassembled part on the neck of the plug housing 17, sealing under the action of the pressing force of the cover 4 on the pressure sensor 1. With the exception of the electric or electronic component parts, 10 and the contacts 19, or the contact pins 16, all other above-mentioned elements are rotationally symmetrical as regards their arrangement and construction. As an alternative of the present invention as shown in the drawings, the profile seal 6 can be enclosed by the plug connector 5.

Figure 2:
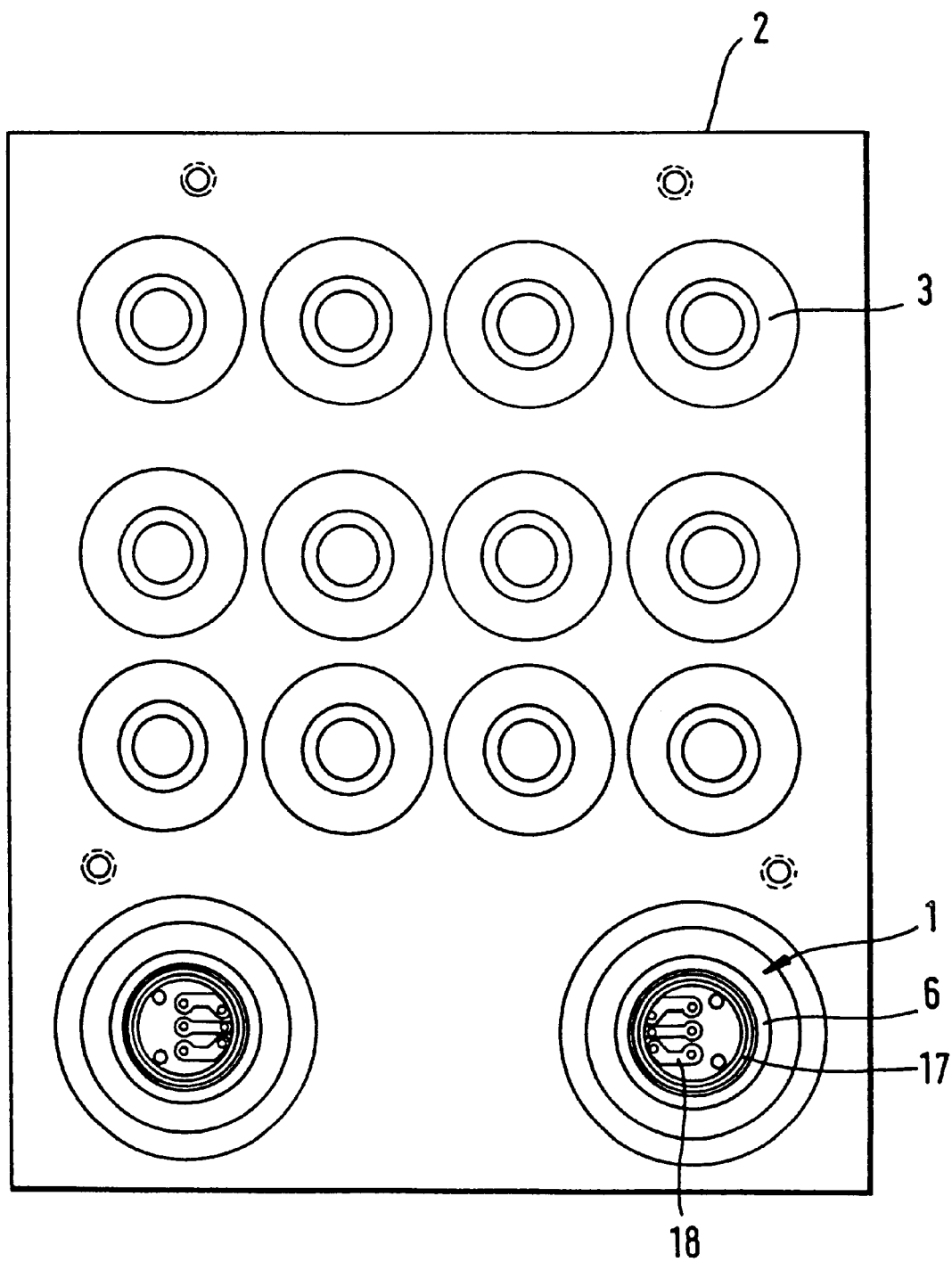
FIG. 2 is a top view of the housing for the pressure modulation valves.

FIG. 2 shows a total top view of the valve housing 2, housing in a plurality of parallel rows the pressure modulation valves 3 and the pressure sensor 1 (shown in FIG. 1) in a double design in one plate. Preferably, housing 2 is made of a softer material than the housings of the pressure sensor 1 and the pressure modulation valves 3. Therefore, the above mentioned pressure sensors 1 and pressure modulation valves 3 can be pressed by self-caulking engagement, in a very simple manufacture in one joint operation, into the housing 2 which is preferably made of light metal. To this end, housing 2 has a symmetric drilling pattern for the stepped bores 12. The distance between two valve rows is chosen so that space for the radial pistons of a pump is left in between the respective valve rows. Further, it can be seen in FIG. 2 that each of the pressure sensors 1, arranged on the same axis laterally offset to the valve rows, has three contact points on the conductor paths 18 configured as a printed circuit board.

Figure 3:
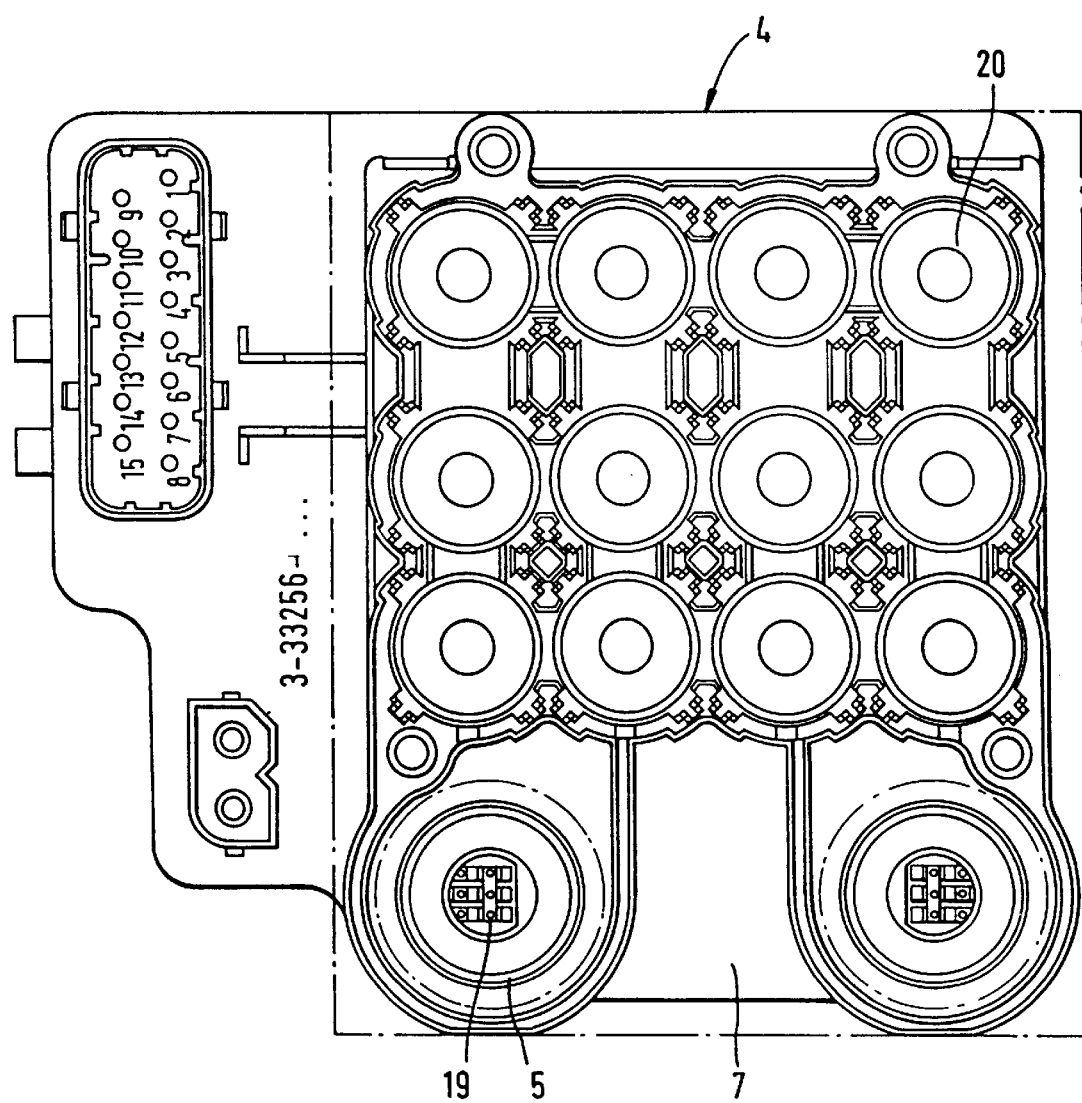
FIG. 3 is the inside view of a cover for the housing shown in FIG. 2.

The plug configuration which interacts with the configuration of the individual elements shown in FIG. 2 can be taken from FIG. 3. FIG. 3 shows the cover 4 which is generally conformed to the block shape of the housing 2. Cover 4 houses the coils 20 for the pressure modulation valves 3 and includes for each pressure sensor 1 the plug connector 5 known from FIG. 1. In the top view of FIG. 3, in addition, the contacts 19 interacting with the contacts of the pressure sensor 1 can be seen in the plug connector 5. Profile seal 6 known from FIG. 1 has an annular configuration in FIG. 2 and is arranged on the plug housing 17. Thus, exclusively the thin-walled webs of the bowl-shaped cover 4 can be seen in FIG. 3. Cover 4 is injection-molded as a frame from a homogeneous plastic part to which also the coils 20 are attached. This provides a largely closed, compact unit of the cover 4 in which all electrical connections for the pressure sensors 1 and the coils 20, as shown in FIG. 1, are integrated. Especially contact pins and conductor paths are particularly appropriate as electrical connections in the sense of a printed circuit board arrangement, and they are preferably cast with plastics in the plug connectors 5 or on the carrier plate 7.

From this results a manufacture in conformity with the demands of automation so that the manufacturing process is reduced to a minimum of operation steps. Cable assemblies and separate cable connections are not required. A largely central plug connection is thereby achieved on the cover 4, due to which all coils 20 and pressure sensors 1 are in contact in a way protected against moisture and short circuits. This achieves a virtual isolation of the hydraulic part of FIG. 2 in relation to the electric or electronic part of FIG. 3, with the result of separate diagnosis and assembly possibilities. A relatively simple self-centering of the coils 20, elastically suspended in the cover 4, is achieved by seating the cover 4 on the block-shaped housing 2. The valve domes of the pressure modulation valves 3 and the plug housing 17 of the pressure sensors 1 project from the housing. Thus, the plug housings 17 of the pressure sensors 1 are also accommodated in the bowl-shaped cover and are pressed against the contact points of the conductor paths 18, preferably by spring-loaded contacts 19.

FIG. 4 shows a vehicle brake system with brake slip control and automatic brake management including a braking pressure generator 22 which is connected to at least one wheel brake 23 and a pressure fluid accumulator 24 by way of pressure modulation valves. At least one pump 26 is connected with its suction side to the pressure fluid accumulator 24 and its pressure side to pressure fluid conduit 13 that extends from the braking pressure generator 22 to the housing 2 which contains the pressure modulation valves and the pressure sensor.

We claim:

1. A hydraulic automotive vehicle brake system with brake slip control and automatic brake management, including a braking pressure generator which is hydraulically connectable to at least one wheel brake and a pressure fluid accumulator by way of pressure modulation valves, at least one pump which is connected with its suction side to the pressure fluid accumulator and with its pressure side to a pressure fluid conduit that extends from the braking pressure generator to the wheel brake, the pressure fluid conduit comprising the pressure modulation valves and a pressure sensor that is connected to the pressure fluid conduit in between the braking pressure generator and the pressure modulation valves, the pressure sensor being accommodated in a housing which houses the pressure modulation valves, wherein a cover is attached to the housing and is arranged on the pressure modulation valves and the pressure sensor, and wherein the cover includes a carrier plate, the carrier plate providing an electrical connection to the pressure sensor.

2. The brake system as claimed in claim 1, wherein a plug connector is fitted between the cover and the pressure sensor.

3. The brake system as claimed in claim 2, wherein a profile seal is interposed between the plug connector and the pressure sensor.

4. The brake system as claimed in claim 1, wherein the pressure sensor includes in a sensor housing a capacitive transducer which is connected to electric and/or electronic components.

5. The brake system as claimed in claim 1, wherein the pressure sensor and the pressure modulation valves are attached in parallel stepped bores of the housing by way of a self-caulking engagement.

* * * * *